United States Patent
Chen et al.

(10) Patent No.: US 12,136,567 B2
(45) Date of Patent: Nov. 5, 2024

(54) FULLY SELF-ALIGNED INTERCONNECT STRUCTURE

(71) Applicant: Taiwan Semiconductor Manufacturing Co., Ltd., Hsin-Chu (TW)

(72) Inventors: Hsin-Ping Chen, Hsinchu (TW); Shau-Lin Shue, Hsinchu (TW); Min Cao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 327 days.

(21) Appl. No.: 17/838,723

(22) Filed: Jun. 13, 2022

(65) Prior Publication Data
US 2022/0328351 A1    Oct. 13, 2022

Related U.S. Application Data

(62) Division of application No. 16/895,338, filed on Jun. 8, 2020, now Pat. No. 11,361,994.

(51) Int. Cl.
*H01L 21/768* (2006.01)
*H01L 21/3213* (2006.01)
*H01L 23/522* (2006.01)
*H01L 23/528* (2006.01)

(52) U.S. Cl.
CPC .. *H01L 21/76897* (2013.01); *H01L 21/32133* (2013.01); *H01L 21/76802* (2013.01); *H01L 21/76843* (2013.01); *H01L 21/76877* (2013.01); *H01L 23/5226* (2013.01); *H01L 23/5283* (2013.01)

(58) Field of Classification Search
CPC ........ H01L 21/76897; H01L 21/32133; H01L 21/76802; H01L 21/76843; H01L 21/76877; H01L 21/76816; H01L 21/7682; H01L 21/76829; H01L 21/76831; H01L 21/76885; H01L 23/5226; H01L 23/5283
See application file for complete search history.

(56) References Cited

U.S. PATENT DOCUMENTS

| | | | |
|---|---|---|---|
| 6,225,211 B1 | 5/2001 | Tsui | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |

(Continued)

*Primary Examiner* — Shahed Ahmed
*Assistant Examiner* — Vicki B. Booker
(74) *Attorney, Agent, or Firm* — HAYNES AND BOONE, LLP

(57) ABSTRACT

The present disclosure provides a method of forming a semiconductor structure. The method includes providing a semiconductor substrate and forming a patterned metal structure on the semiconductor substrate, wherein the patterned metal structure includes a first metal layer and a second metal layer deposited in a single deposition step. The method further includes etching a portion of the second metal layer thereby forming a metal plug in the second metal layer, the first metal layer of the patterned metal structure having a first metal feature underlying and contacting the metal plug.

20 Claims, 19 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,567,814 B2 | 2/2017 | Wu et al. |
| 2015/0118842 A1 | 4/2015 | Lee |
| 2016/0086846 A1* | 3/2016 | Lee .................. H01L 21/76834 |
| | | 438/652 |
| 2016/0111368 A1* | 4/2016 | Zhang ............... H01L 21/76804 |
| | | 257/773 |
| 2016/0155701 A1 | 6/2016 | Mignot et al. |
| 2016/0343708 A1* | 11/2016 | Park .................. H01L 21/76895 |

* cited by examiner

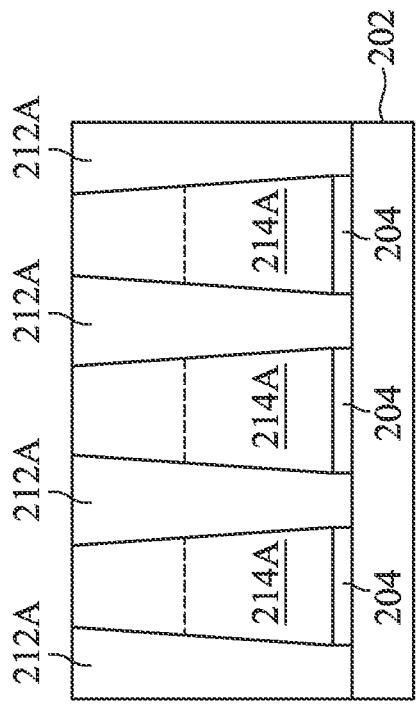
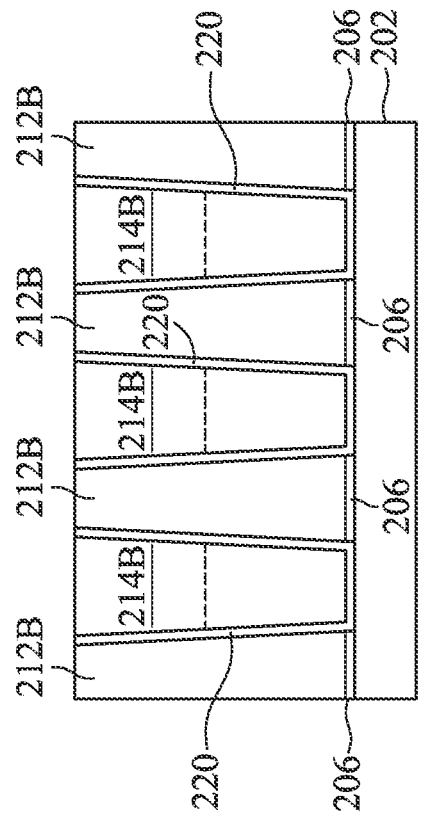
FIG. 7A
FIG. 7B

FULLY SELF-ALIGNED INTERCONNECT STRUCTURE

PRIORITY DATA

This application is a divisional patent application of U.S. patent application Ser. No. 16/895,338 filed Jun. 8, 2020, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2B, 3A-3B, 4A-4B, 5, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, and 19A-19B are section views of an interconnect structure of a semiconductor device at various stages of fabrication, according to various aspects of the present disclosure.

DETAILED DESCRIPTION

Figure 1:
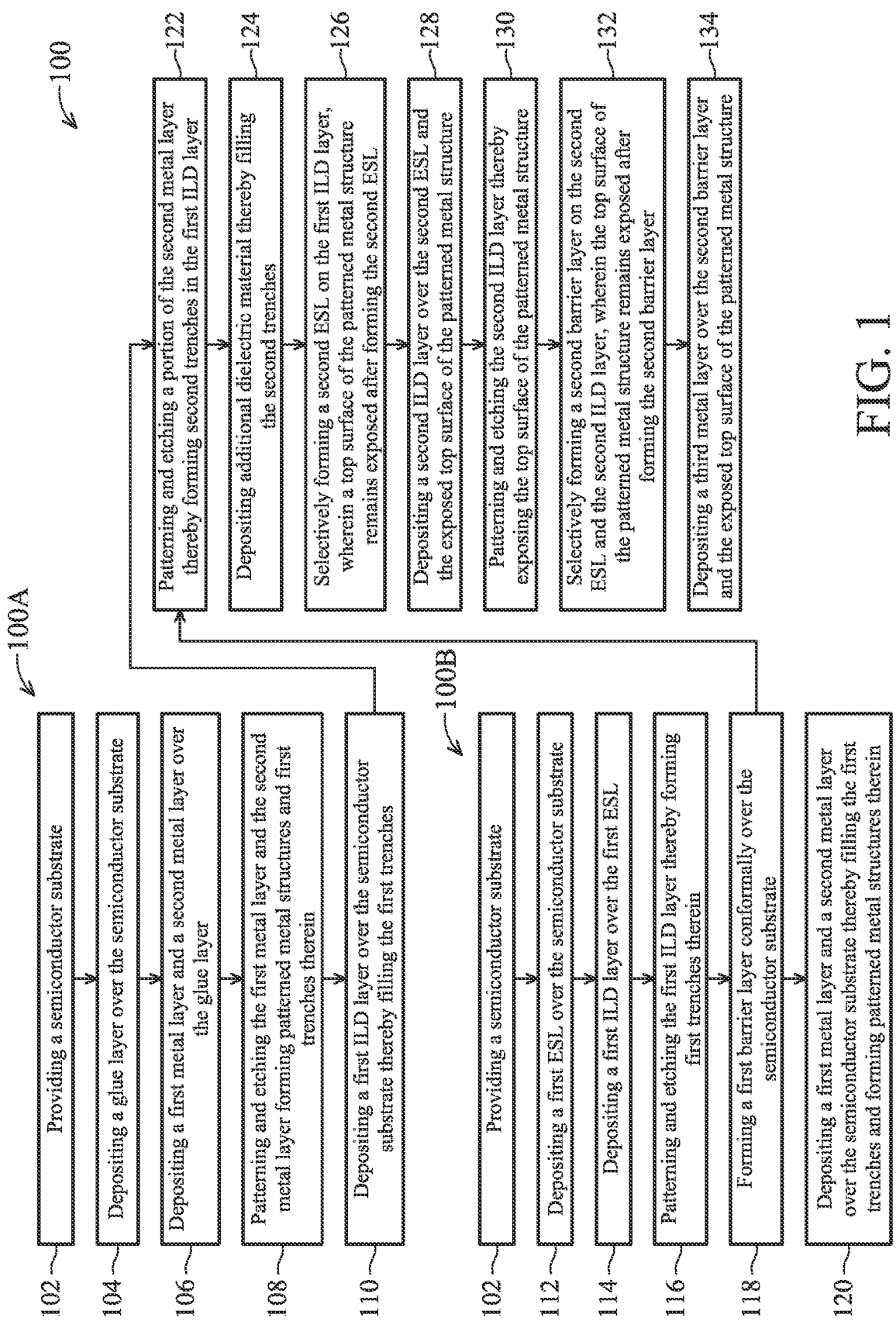
FIG. 1 is a flow chart of a method for fabricating an interconnect structure of a multilayer interconnect feature according to various aspects of the present disclosure.

The present disclosure relates generally to integrated circuit (IC) devices, and more particularly, to multi-layer interconnect features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, MEOL and BEOL processes are experiencing significant challenges. For example, advanced IC technology nodes require more compact MLI features, which requires significantly reducing critical dimensions of interconnects of the MLI features (for example, widths and/or heights of vias and/or conductive lines of the interconnects). The reduced critical dimensions have led to significant increases in interconnect resistance, which can degrade IC device performance (for example, by increasing resistance-capacitance (RC) delay).

The present disclosure describes barrier-free and self-aligned interconnect architecture to replace traditional damascene architecture on BEOL metal tight pitches. Barrier-free and self-aligned architecture may lower contact resistance by expanding contact area and eliminating contact barriers and improve reliability by expanding reliability margins. Furthermore, barrier-free and self-aligned architecture may lower capacitance on minimum pitch, reduce Mx-Vx leakage. Barrier-free and self-aligned architecture may also manage low-R and low-C with TDDB margin, lower power consumption, and boost speed.

The present disclosure describes forming Mx and Vx layers together to eliminate contact barrier between Mx and Vx and achieve self-alignment between Mx and Vx. Furthermore, selective deposition steps are implemented to form Vx and Mx+1 without contact barrier and self-aligned. Different embodiments may have different advantages, and no particular advantage is required of any embodiment.

FIG. 1 illustrates a flow chart of a method for fabricating a BEOL interconnect structure of a semiconductor device according to various aspects of the present disclosure. The method may include portions 100A, 100B, 100. FIGS. 2A-2B, 3A-3B, 4A-4B, 5, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, and 19A-19B are section views of an interconnect structure of a semiconductor device at various stages of fabrication according to various embodiments of method 100A, 100B, 100 of the present disclosure. Additional steps can be provided before, during, and after method 100, and some of the steps described can be moved, replaced, or eliminated for additional embodiments of method 100. Additional features can be added in the interconnect structure depicted in FIGS. 2A-2B, 3A-3B, 4A-4B, 5, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, and 19A-19B, and some of the features described below can be replaced, modified, or eliminated in other embodiments of the interconnect structure depicted in FIGS. 2A-2B, 3A-3B, 4A-4B, 5, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, and 19A-19B.

FIG. 1 is a flow chart illustrating methods 100, 100A, 100B of fabricating a semiconductor structure or interconnect structure 200 of a semiconductor device according to various aspects of the present disclosure. In some embodiments, the semiconductor structure 200 may be a BEOL interconnect structure. The semiconductor structure 200 can be included in a microprocessor, a memory, and/or other IC device. In some implementations, the semiconductor structure 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multigate transistors, such as fin-like FETs (FinFETs). FIGS. 2A-2B, 3A-3B, 4A-4B, 5, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, and 19A-19B have been simplified for the sake of clarity to better understand the inventive concepts of the present disclosure. Additional features can be added in the semiconductor structure 200, and some of the features described below can be replaced, modified, or eliminated in other embodiments of the semiconductor structure 200.

The semiconductor structure 200 may electrically couple various devices (for example, transistors, resistors, capacitors, and/or inductors) and/or components (for example, gate structures and/or source/drain features) of the semiconductor device, such that the various devices and/or components can operate as specified by design requirements of the semiconductor device. The semiconductor structure 200 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines (or metal lines). Vertical interconnect features typically connect horizontal interconnect features in different layers the semiconductor structure 200. During operation, the interconnect features are configured to route signals between the devices and/or the components of the semiconductor device and/or distribute signals (for example, clock signals, voltage signals, and/or ground signals) to the devices and/or the components of the semiconductor device. Though the semiconductor structure 200 is depicted with a given number of dielectric layers and conductive layers, the present disclosure contemplates the semiconductor structure 200 having any number of dielectric layers and/or conductive layers.

Figures 2A, 2B:
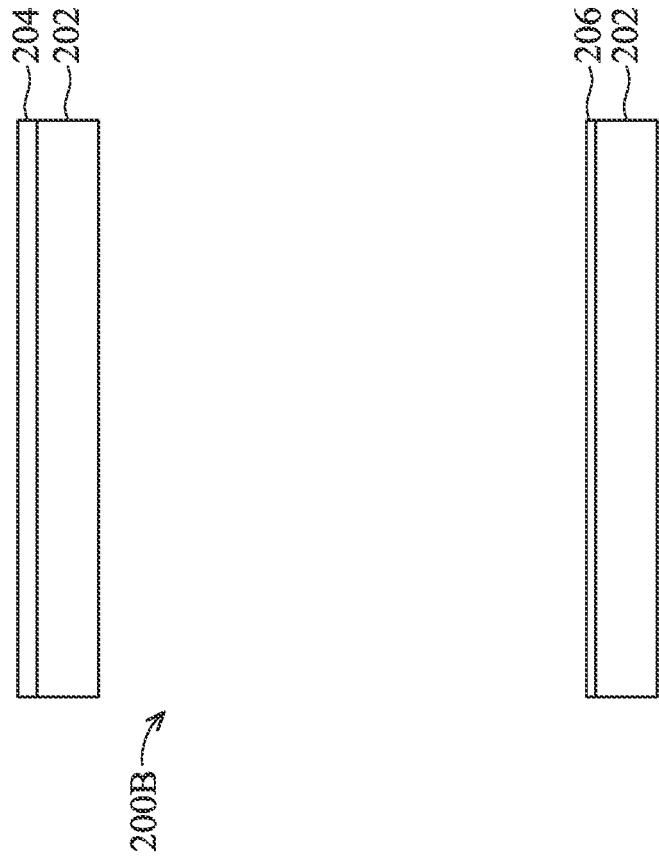

Referring jointly to FIG. 1 and FIGS. 2A-2B, each of the methods 100A, 100B of fabricating the respective semiconductor structures 200A, 200B include a block 102 where a semiconductor substrate or wafer 202 is provided. In some embodiments, the semiconductor substrate 202 may include silicon. In some embodiments, the substrate 202 may include another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 may include one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 202 can include various doped regions (not shown) configured according to design requirements of the semiconductor device, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, the substrate 202 may include doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping process can be performed to form the various doped regions.

In some embodiments, the substrate 202 may include isolation features (not shown). The isolation features may be formed over and/or in the substrate 202 to isolate various regions, such as various device regions, of the semiconductor device. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in the substrate 202 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

In some embodiments, the substrate 202 may include various gate structures (not shown). The gate structures may be disposed over the substrate 202 and one or more gate structures may interpose a source region and a drain region, where a channel region is defined between the source region and the drain region. The one or more gate structures engage the channel region, such that current can flow between the source/drain regions during operation. In some implementations, gate structures may be formed over a fin structure, such that gate structures each wrap a portion of the fin structure. For example, one or more of gate structures wrap channel regions of the fin structure, thereby interposing source regions and drain regions of the fin structure. In some embodiments, gate structures include metal gate (MG) stacks that are configured to achieve desired functionality according to design requirements of the semiconductor device. In some implementations, metal gate stacks may include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials may include hafnium, aluminum, zirconium, lanthanum, tantalum, titanium, yttrium, oxygen, nitrogen, other suitable constituent, or combinations thereof. In some implementations, the gate dielectric may include a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode may include multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer may include a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials may include TiN, TaN, Ru, Mo, Al, WN, $ZrSi_2$, $MoSi_2$, $TaSi_2$, $NiSi_2$, WN, other p-type work function material, or combinations thereof. N-type work function materials may include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer may include metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

In some embodiments, the substrate 202 may include epitaxial source features and epitaxial drain features (not shown). The epitaxial source/drain features may be disposed in source/drain regions of the substrate 202. The gate structures and epitaxial source/drain features form a portion of a transistor of the semiconductor device. Gate structure and/or epitaxial source/drain features are thus alternatively referred to as device features. In some implementations, epitaxial source/drain features wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable selective epitaxial growth (SEG) processes, or combinations thereof. Epitaxial source/drain features may be doped with n-type dopants and/or p-type dopants. In some implementations, where the transistor is configured as an n-type device (for example, having an n-channel), epitaxial source/drain features can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features can be silicon-and-germanium-containing epitaxial layers doped with boron, other p-type dopant, or combinations thereof (for example, forming Si:Ge:B epitaxial layers). In some implementations, annealing processes may be performed to activate dopants in epitaxial source/drain features of the semiconductor device.

In some implementations, silicide layers may be formed on epitaxial source/drain features. In some implementations, silicide layers may be formed by depositing a metal layer over epitaxial source/drain features. The metal layer includes any material suitable for promoting silicide formation, such as nickel, platinum, palladium, vanadium, titanium, cobalt, tantalum, ytterbium, zirconium, other suitable metal, or combinations thereof. The semiconductor device is then heated (for example, subjected to an annealing process) to cause constituents of epitaxial source/drain features (for example, silicon and/or germanium) to react with the metal. The silicide layers thus include metal and a constituent of epitaxial source/drain features (for example, silicon and/or germanium). In some implementations, the silicide layers may include nickel silicide, titanium silicide, or cobalt silicide. Any un-reacted metal, such as remaining portions of the metal layer, is selectively removed by any suitable process, such as an etching process.

Referring to FIG. 1 and FIG. 2A, the method 100A proceeds to block 104 by depositing a glue layer 204 over the semiconductor substrate 202. The glue layer 204 can include a material that promotes adhesion between adjacent layers. In some embodiments, the glue layer 204 may include metal (for example, W, Al, Ta, Ti, Ni, Cu, Co, other suitable metal, or combinations thereof), metal oxides, metal nitrides (for example, TaN, TiN), metal carbides (for example, WC, WSiC), or combinations thereof. In some embodiments, the glue layer 204 may be deposited using physical vapor deposition (PVD), chemical vapor deposition (CVD), or other suitable methods. In some other embodiments, the glue layer 204 may be omitted from the semiconductor structure 200A.

Referring to FIG. 1 and FIG. 2B, the method 100B proceeds to block 112 by depositing a first etch stop layer (ESL) 206 over the semiconductor substrate 202. In some embodiments, the first ESL 206 may include silicon oxides (for example, SiOC), silicon nitrides (for example, SiCN, SiN, SiON), silicon carbides (for example, SiC), metal oxides, other suitable materials, or combinations thereof. In some embodiments, the first ESL 206 may be formed by a deposition process (such as CVD, PVD, ALD, HDPCVD, MOCVD, RPCVD, PECVD, LPCVD, ALCVD, APCVD, FCVD, plating, other suitable methods, or combinations thereof). After depositing the first ESL 206, a CMP process and/or other planarization process may be performed, such that the first ESL 206 has a substantially planar surface for enhancing formation of overlying layers.

Figures 3A, 3B:
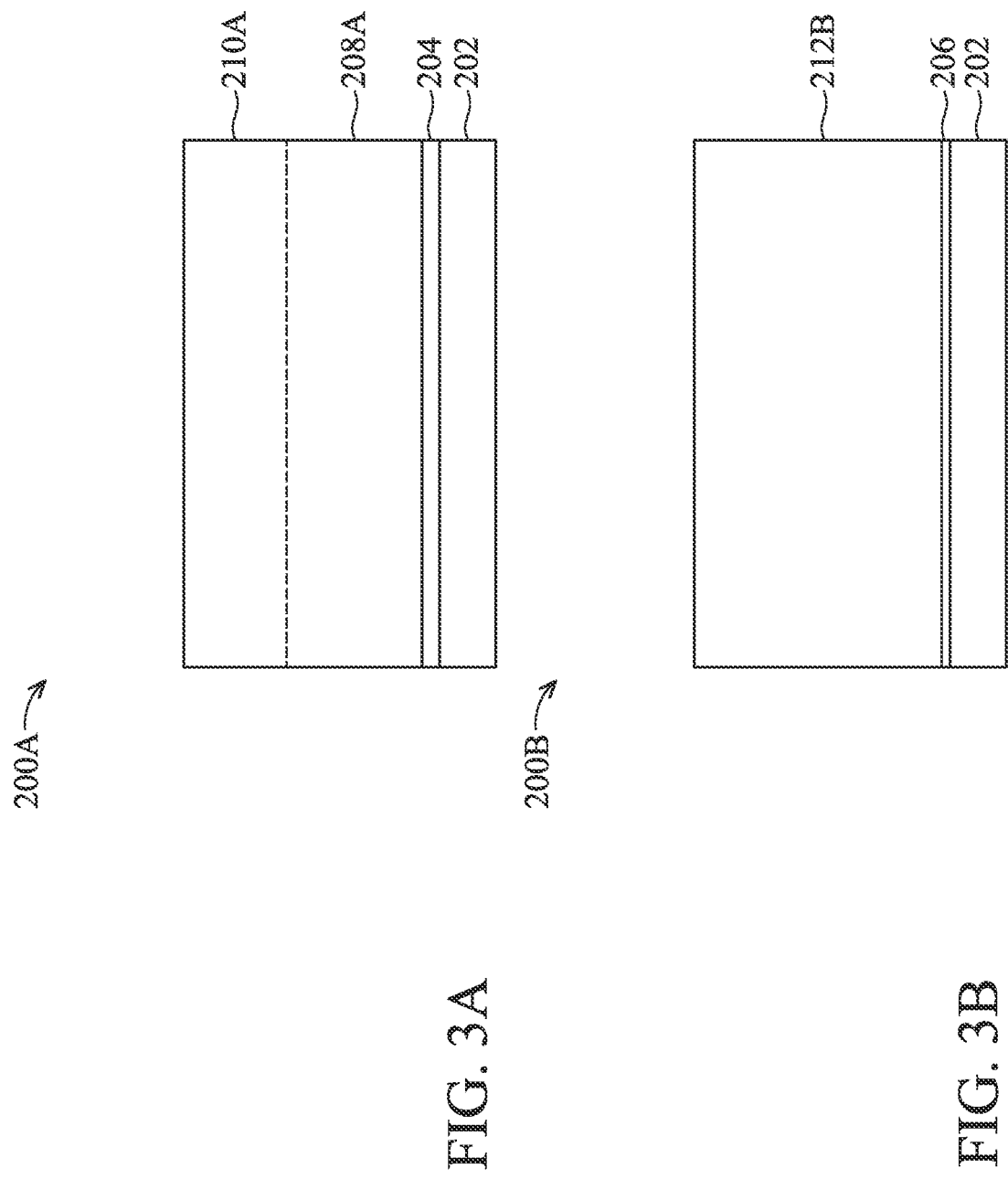

Referring to FIG. 1 and FIG. 3A, the method 100A proceeds to block 106 by depositing a first metal layer 208A and a second metal layer or via layer 210A over the glue layer 204. In some embodiments, the first metal layer 208A and the second metal layer 210A may be formed of any suitable conductive material, such as Cu, Co, Ru, W, Mo, Ni, Cr, Ir, Pt, Rh, Ta, Ti, Al, TaN, TiN, compounds, or other suitable conductive materials. In some embodiments the first metal layer 208A and the second metal layer 210A may be deposited using PVD, CVD, ALD, electroplating, ELD, or other suitable deposition process, or combinations thereof. In some embodiments, the first metal layer 208A and the second metal layer 210A may be formed in a single deposition step. In other words, the first metal layer 208A and the second metal layer 210A may be formed simultaneously. In other embodiments, the first metal layer 208A may be formed in a first step, and the second metal layer 210A may be formed in a second step immediately following the first step. Thereafter, any excess material can be removed by a planarization process, such as a CMP process, thereby planarizing a top surface of the second metal layer 210A. In some embodiments, the first metal layer 208A and the second metal layer 210A may be treated to form a capping layer including silicide, metal nitride, or metal carbide.

Referring to FIG. 1 and FIG. 3B, the method 100B proceeds to block 114 by depositing a first ILD layer 212B over the first ESL 206. In some embodiments, the first ILD layer 212B may be formed of any suitable dielectric material, including without limitation silicon oxide, silicon nitride, silicon oxynitride, TEOS formed oxide, PSG, BPSG, low-k dielectric material, other suitable dielectric materials, or combinations thereof. Exemplary low-k dielectric materials may include SiOC, FSG, carbon doped silicon oxide, Black Diamond® (Applied Materials of Santa Clara, Calif.), Xerogel, Aerogel, amorphous fluorinated carbon, Parylene, BCB, SILK (Dow Chemical of Midland, Mich.), polyimide, or combinations thereof. In some embodiments, the first ILD layer 212B may be formed by a deposition process (such as CVD, PVD, ALD, HDPCVD, MOCVD, RPCVD, PECVD, LPCVD, ALCVD, APCVD, FCVD, plating, other suitable methods, or combinations thereof). After depositing the first ILD layer 212B, a CMP process and/or other planarization process may be performed, such that the first ILD layer 212B has a substantially planar surface for enhancing formation of overlying layers.

Figure 4A:
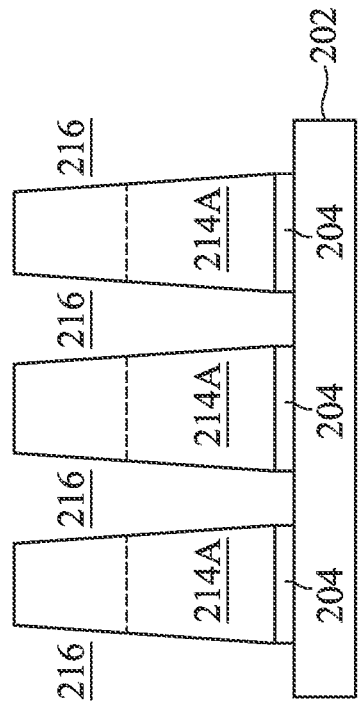

Referring to FIG. 1 and FIG. 4A, the method 100A proceeds to block 108 by patterning and etching the first metal layer 208A and the second metal layer 210A thereby forming patterned metal structures 214A and first trenches 216 therein. In some embodiments, patterning the first metal layer 208A and the second metal layer 210A can include lithography processes and/or etching processes to form first trenches 216. In some embodiments, the patterning and etching of the first metal layer 208A and the second metal layer 210A is performed in a single patterning process. In some implementations, a lithography process may include forming a resist layer over the second metal layer 210A. The lithography process may further include exposing the resist layer to pattern radiation. The lithography process may also include developing the exposed resist layer, thereby forming a patterned resist layer. The patterned resist layer can be used as a masking element for etching openings in the first metal layer 208A and the second metal layer 210A. The etching processes can include reactive ion etching, dry etching processes, wet etching processes, other etching processes, or combinations thereof. In some embodiments, etching gas includes Cl-based etching gas (such as $SiCl_2$, $SiCl_4$ or a combination thereof), F-based (such as $CF_4$, $CF_3$, $C_4F_8$, $NF_3$, or a combination thereof), $N_2$, $O_2$, or a combination thereof depending on metal scheme in the first and second metal layers.

Figure 4B:
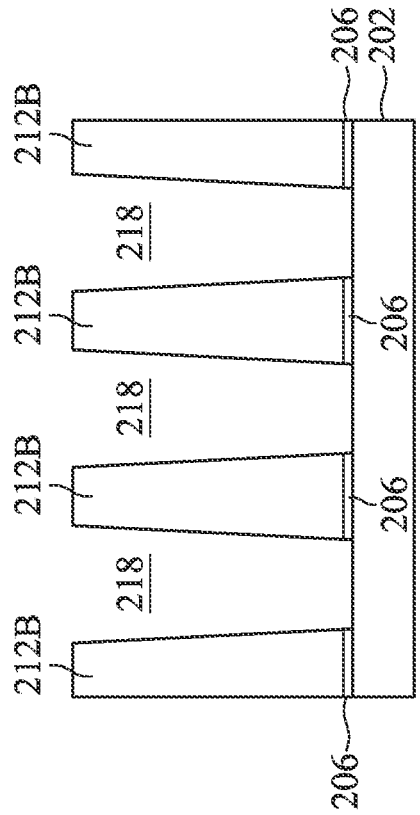

Referring to FIG. 1 and FIG. 4B, the method 100B proceeds to block 116 by patterning and etching the first ILD layer 212B thereby forming first trenches 218 therein. In some embodiments, patterning the first ILD layer 212B can include lithography processes and/or etching processes to form first trenches 218. In some embodiments, the patterning and etching of the first ILD layer 212B is performed in a single patterning process. In some implementations, a lithography process may include forming a resist layer over the first ILD layer 212B. The lithography process may further include exposing the resist layer to pattern radiation. The lithography process may also include developing the exposed resist layer, thereby forming a patterned resist layer. The patterned resist layer can be used as a masking element for etching openings in the first ILD layer 212B. The etching processes can include dry etching processes, wet etching processes, other etching processes, or combinations thereof. In some embodiments, the etching processes include fluorocarbon radicals and oxygen. In some embodiments, etching processes include hydrofluoric acid.

Figure 5:
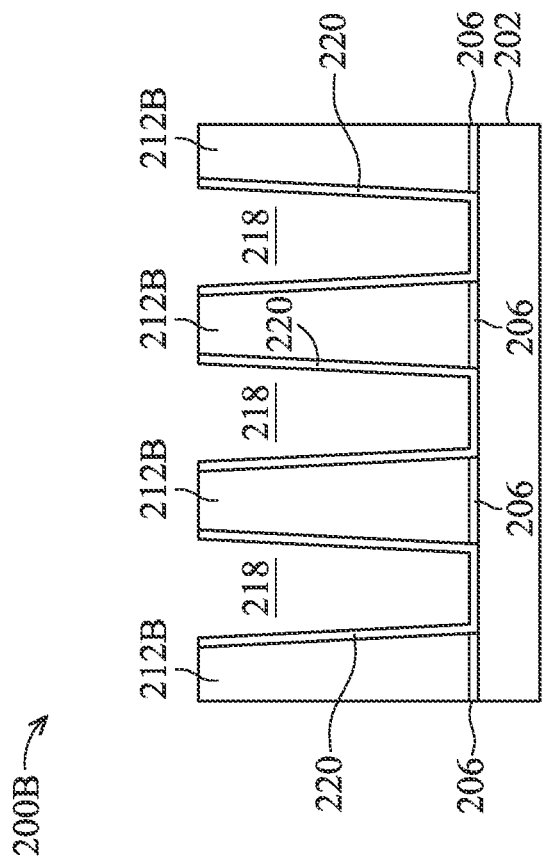

Referring to FIG. 1 and FIG. 5, the method 100B proceeds to block 118 by forming a first barrier layer 220 conformally over the semiconductor substrate 202. In some embodiments, the first barrier layer 220 may be formed of Ta, TaN, TaC, Ti, TiN, TiC, and other suitable materials that can block oxygen diffusion. In some embodiments, the first barrier layer 220 may be deposited using ALD, CVD, or ELD. In some implementations, an optional liner (not shown) may be formed on the barrier layer 220. In such implementations, the liner may be formed of suitable metal, metal nitride, or metal carbide, such as Co, CoN and RuN. In some implementations, the liner may be deposited using ALD, CVD, ELD, or PVD.

Figure 6A:
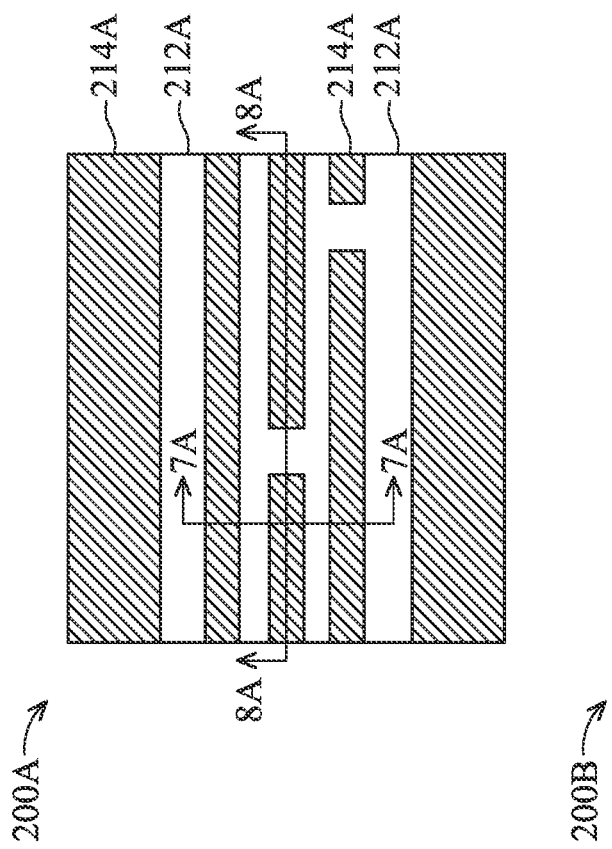
Figure 8A:
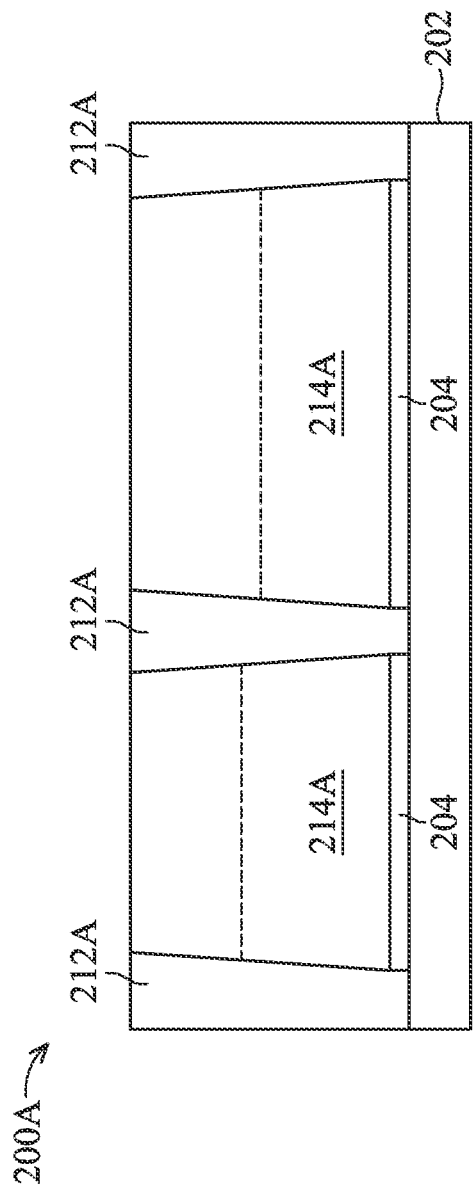

FIGS. 6A, 7A, and 8A are a top view, a side section view along line 7A of FIG. 6A, and a side section view along line 8A of FIG. 6A, respectively. Referring jointly to FIG. 1 and FIGS. 6A, 7A, and 8A, the method 100A proceeds to block 110 by depositing a first ILD layer 212A over the semiconductor substrate 202 thereby filling first trenches 216. The foregoing method may incorporate detailed description of like structures, methods, and compositions from FIG. 3B and block 114 describing deposition of the first ILD layer 212B without limitation. In some embodiments, one or more air gaps AG may be formed within the first ILD layer 212A. The one or more air gaps AG may result from filling dielectric material into trenches 216 having a narrow profile. In some embodiments, the air gaps AG may have an oval shape substantially aligned along a vertical axis of the semiconductor structure 200A. Thereafter, any excess material can be removed by a planarization process, such as a CMP process, thereby planarizing top surfaces of the first ILD layer 212A and patterned metal structures 214A.

Figure 6B:
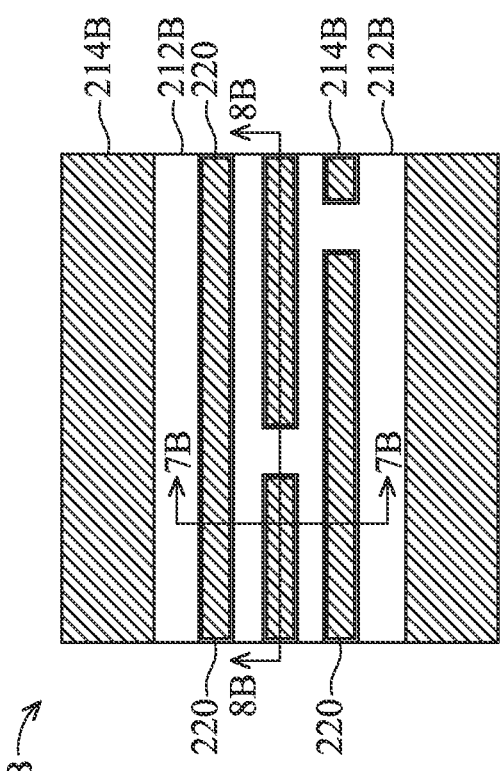
Figure 8B:
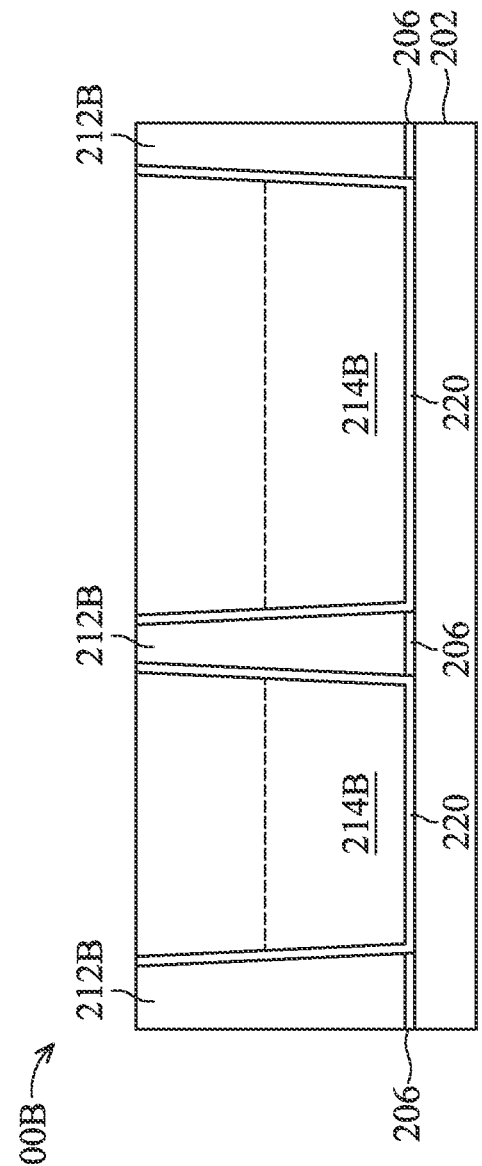

FIGS. 6B, 7B, and 8B are a top view, a side section view along line 7B of FIG. 6B, and a side section view along line 8B of FIG. 6B, respectively. Referring jointly to FIG. 1 and FIGS. 6B, 7B, and 8B, the method 100B proceeds to block 120 by depositing a first metal layer 208B and a second metal layer 210B over the semiconductor substrate 202 thereby filling first trenches 218 and forming patterned metal structures 214B therein. The foregoing method may incorporate detailed description of like structures, methods, and compositions from FIG. 3A and block 106 describing deposition of the first metal layer 208A and the second metal layer 210A without limitation. In some embodiments, the first metal layer 208B and the second metal layer 210B may directly contact one of the first ILD layer 212B, the first barrier layer 220, or the optional liner (not shown). Thereafter, any excess material can be removed by a planarization process, such as a CMP process, thereby planarizing top surfaces of the first ILD layer 212B and patterned metal structures 214B.

Figure 9A:
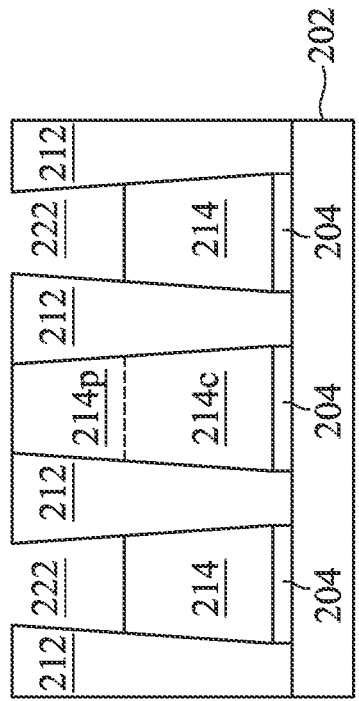
Figure 9B:
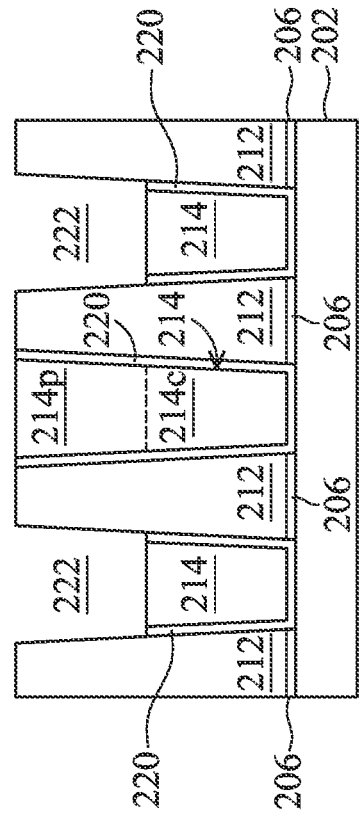

Referring to FIG. 1 and FIGS. 9A-9B, the method 100 proceeds to block 122 by patterning and etching the second metal layer 210 thereby forming second trenches 222 in the first ILD layer 212. Portions of the second metal layer 210 remaining unetched by patterning and etching, will form metal plugs 214p of patterned metal structures 214. Portions of patterned metal structures 214 underlying and contacting metal plugs 214p will form first metal features 214c, which may include, without limitation, metal lines or metal contact features. In some embodiments, metal plugs 214p and first metal features 214c may be in direct contact with each other and may have a same composition. In some embodiments, an interface between the metal plug 214p and the first metal feature 214c may be free of any contact barrier. Forming the first metal layer 208 and the second metal layer 210 together or in subsequent steps followed by metal etching of portions of the second metal layer 210 to form metal plugs 214p and first metal features 214c represents a self-alignment process. In some embodiments, the metal plug 214p and first metal feature 214c may be self-aligned having a continuous sidewall slope from the metal plug 214p to the first metal feature 214c. In other words, metal plugs 214p and first metal features 214c are self-aligned in that they are formed and then selectively etched instead of metal plugs 214p being selectively deposited on first metal features 214c which can cause misalignment. In some embodiments, the etching process may be selective for metal material of the second metal layer 210 compared to dielectric material of the first ILD layer 212. In such embodiments, portions of the second metal layer 210 may be removed without degrading adjacent portions of the first ILD layer 212. Removal of portions of the second metal layer 210 may form second trenches 222. In embodiments illustrated in FIG. 9A, second trenches 222 expand in width from top to bottom. Whereas in embodiments illustrated in FIG. 9B, second trenches 222 narrow in width from top to bottom. Furthermore, in embodiments illustrated in FIG. 9B, etching may remove portions of the first barrier layer 220 and optional liner adjacent the second metal layer 210. The foregoing method may incorporate detailed description of like structures, methods, and compositions from FIG. 4A and block 108 describing patterning and etching of the second metal layer 210A without limitation.

Figure 10A:
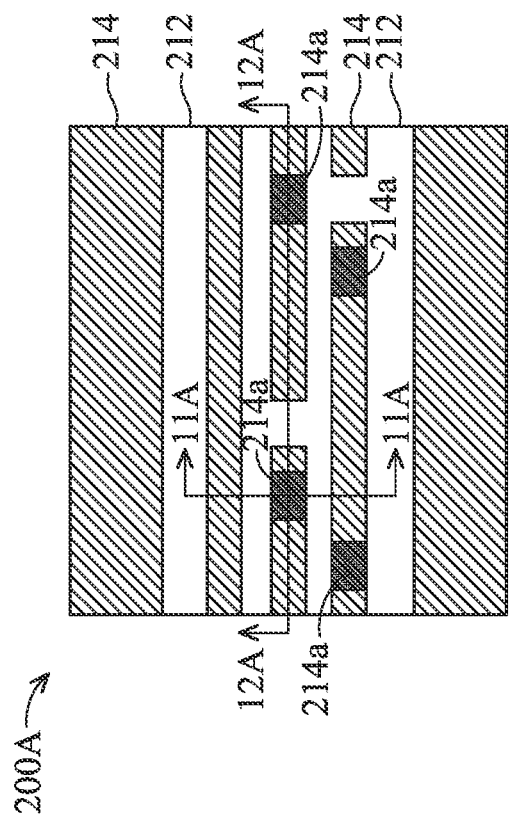
Figure 10B:
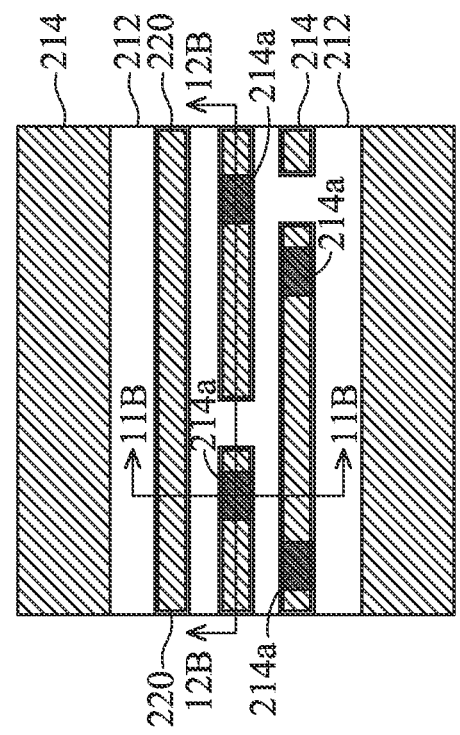
Figure 11A:
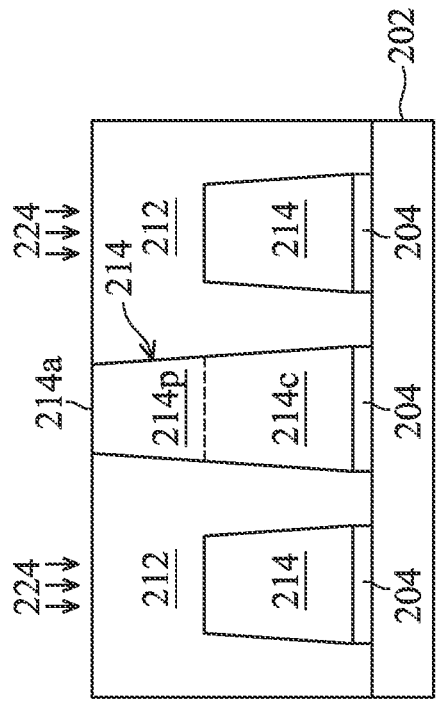
Figure 11B:
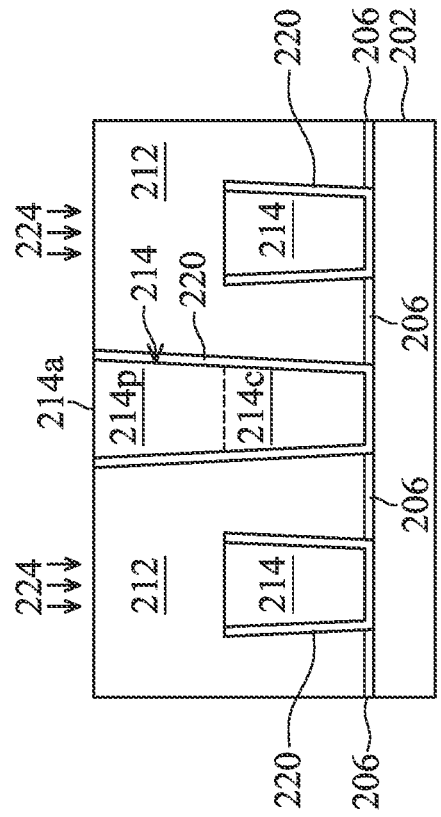
Figure 12A:
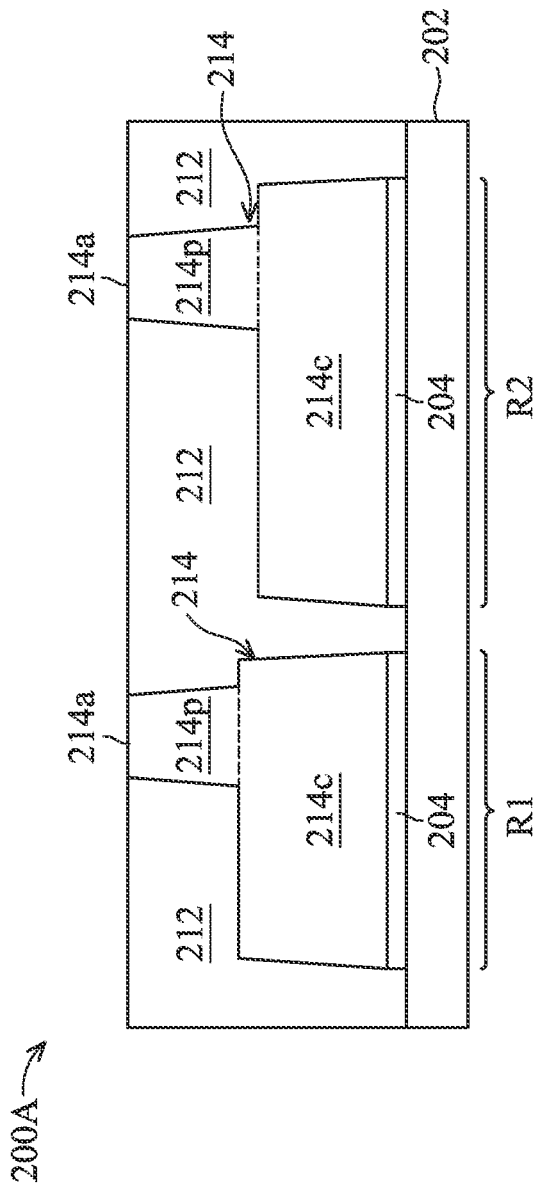
Figure 12B:
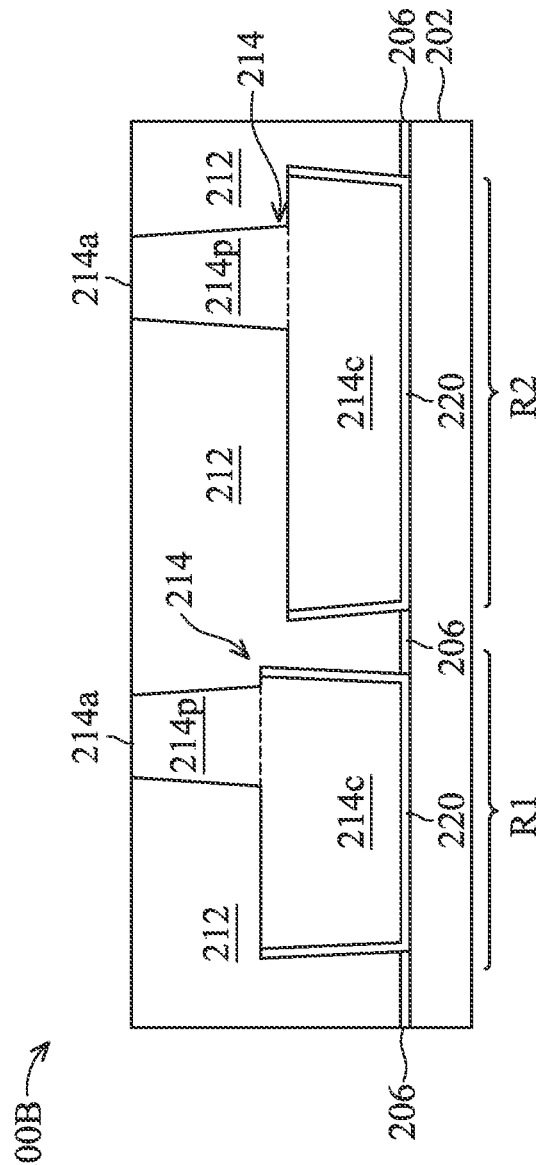

FIGS. 10A, 11A, and 12A are a plan view, a side section view along line 11A of FIG. 10A, and a side section view along line 12A of FIG. 10A, respectively, showing the semiconductor structure 200A at a step during fabrication. Likewise, FIGS. 10B, 11B, and 12B are a plan view, a side section view along line 11B of FIG. 10B, and a side section view along line 12B of FIG. 10B, respectively, showing the semiconductor structure 200B at a step during fabrication. Referring jointly to FIG. 1 and FIGS. 10A, 10B, 11A, 11B, 12A, and 12B, the method 100 proceeds to block 124 by depositing additional dielectric material 224 thereby filling second trenches 222. In particular, FIGS. 10A-10B show the first ILD layer 212 and patterned metal structures 214 in cross-section having positions of exposed top surfaces 214a of patterned metal structures 214 overlaid thereon.

Referring specifically to FIGS. 12A-12B, in some embodiments, etching the second metal layer 210 at block 122 may result in a recess etching loading effect where first metal features 214c in a first region R1 may be etched less than first metal features 214c in a second region R2. In some embodiments, recess etching loading effect may include density loading effect and pattern loading effect and may be caused by different etching rate between first and second regions R1, R2. Thus, recess etching loading effect may result in top surfaces of first metal features 214c being at different heights between first region R1 and second region R2 within the same semiconductor structure 200A, 200B. In some embodiments, top surfaces of first metal features 214c in first and second regions R1, R2 may differ in height by approximately 10 nm-500 nm. In some embodiments, an aspect ratio of first metal features 214c may be approximately 1.5-4. In some embodiments, an aspect ratio of first metal features 214c and metal plugs 214p in combination may be approximately 4-7.

The foregoing method may incorporate detailed description of like structures, methods, and compositions from FIG. 3B and block 114 describing deposition of the first ILD layer 212B without limitation. Thereafter, any excess material can be removed by a planarization process, such as a CMP process, thereby planarizing top surfaces of the first ILD layer 212 and top surfaces 214a of the patterned metal structure 214.

Figure 13A:
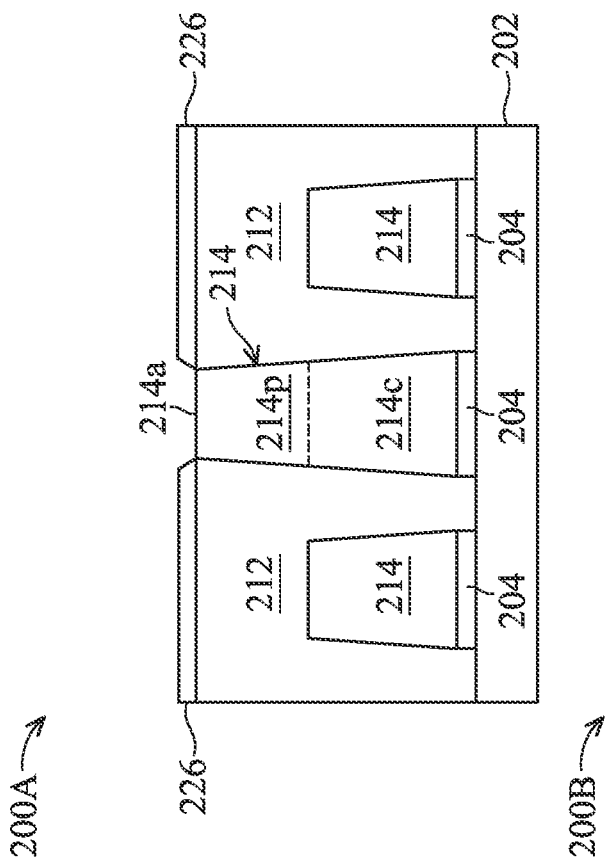
Figure 13B:
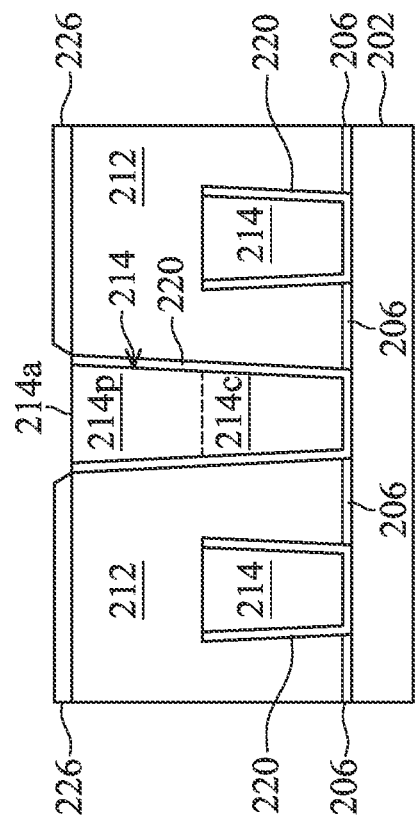

Referring to FIG. 1 and FIGS. 13A-13B, the method 100 proceeds to block 126 by selectively forming a second ESL 226 on the first ILD layer 212, wherein a top surface 214a of a patterned metal structure 214 remains exposed after forming the second ESL 226. In some embodiments, the second ESL 226 may be selectively formed using a multi-step process. In some embodiments, a selectively deposited self-assembled monolayer (SAM) may be formed on the top surface 214a before depositing the second ESL 226. In various embodiments, the SAM may be deposited using a vapor process, including without limitation CVD, ALD, or molecular layer deposition, or using a wet process, including without limitation spin-on coating or dipping. In some embodiments, materials making-up the SAM may selectively grow only on a metal layer, such as the patterned metal structure 214 and not on a dielectric layer, such as the first ILD layer 212. In some embodiments, the SAM may include a head group (or anchor) including phosphorus (P), sulfur (S), or silicon (Si), which in some cases may be in the form of phosphate, sulfate, or silane. In some examples, the SAM (or the head group of the SAM) may include ODPA (octadecylphosphonic acid), organosulfur, or thiol (e.g., dodecanethiol, alkanethiol). The tail group may include a carbon chain, including without limitation alkenes and alkynes. In some embodiments, the tail may include an alkyl chain. In various examples, the head group may have a high affinity to the patterned metal structure 214 and may only bind to the top surface 214a of the patterned metal structure 214 and not to a top surface of the first ILD layer 212 adjacent the patterned metal structure 214.

In some embodiments, after forming the SAM, the second ESL 226 may be deposited on the first ILD layer 212. Whereas surfaces covered by the SAM, such as the exposed top surface 214a of the patterned metal structure 214, may remain substantially free of the second ESL 226 by selective deposition. In this regard, because precursors of the second ESL 226 may have low affinity to the SAM (i.e., the SAM may repel precursors of the second ESL 226), the SAM may function as a blocking layer for the second ESL 226. In some embodiments, a final step of the selective deposition of the second ESL 226 may include removing the SAM by selective etching or through an annealing process.

The foregoing method may incorporate detailed description of like structures, methods, and compositions from FIG. 2B and block 112 describing deposition of the first ESL 206 without limitation. After depositing the second ESL 226, a CMP process and/or other planarization process may be performed, such that the second ESL 226 has a substantially planar surface for enhancing formation of overlying layers.

Figure 14A:
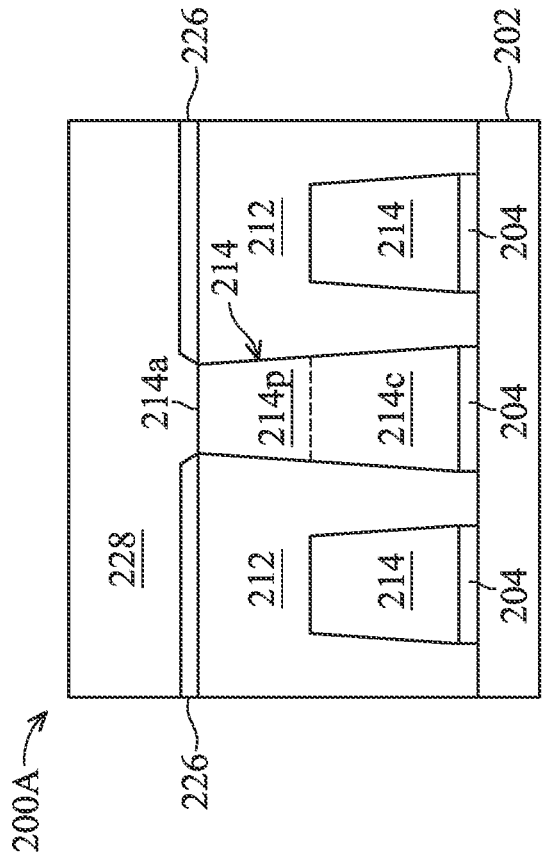
Figure 14B:
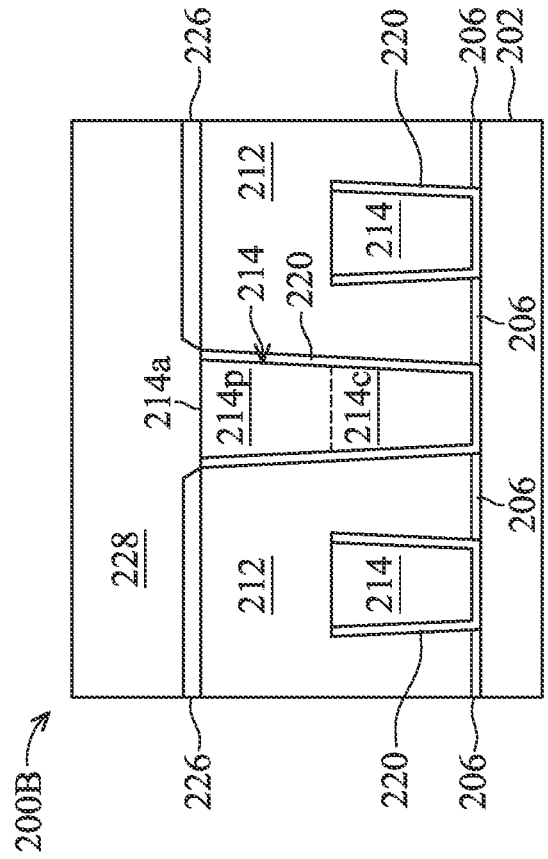

Referring to FIG. 1 and FIGS. 14A-14B, the method 100 proceeds to block 128 by depositing a second ILD layer 228 over the second ESL 226 and the exposed top surface 214a of the patterned metal structure 214. The foregoing method may incorporate detailed description of like structures, methods, and compositions from FIG. 3B and block 114 describing deposition of the first ILD layer 212B without limitation. After depositing the second ILD layer 228, a CMP process and/or other planarization process may be performed, such that the second ILD layer 228 has a substantially planar surface for enhancing formation of overlying layers.

Figure 15A:
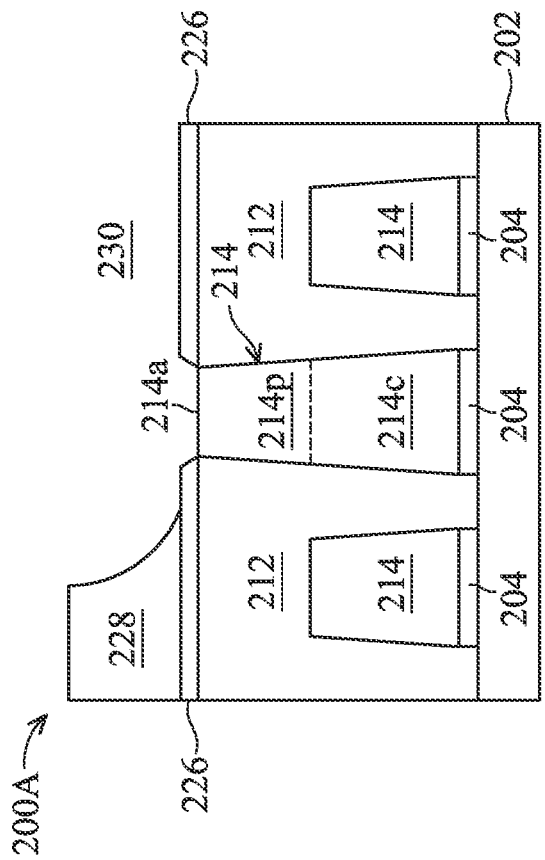
Figure 15B:
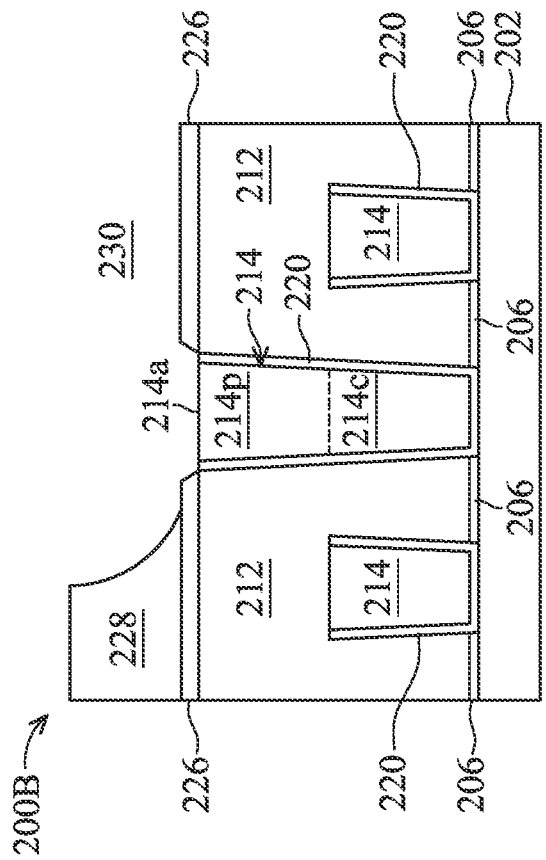

Referring to FIG. 1 and FIGS. 15A-15B, the method 100 proceeds to block 130 by patterning and etching the second ILD layer 228 thereby exposing the top surface 214a of the patterned metal structure 214. The etching process may form third trenches 230 in the second ILD layer 228. The second ESL 226 may provide etching selectivity, whereby the second ILD layer 228 is removed without degrading the second ESL 226. In other words, the etching of the second ILD layer 228 may include performing an etching process using an etchant to selectively etch the second ILD layer 228 relative to the ESL 226. In some embodiments, the etching of the second ILD layer 228 may include applying an etchant with selective etch to the metal plug 214p and the first ILD layer 212 relative to the ESL 226. By selectively etching the second ILD layer 228, the third trench 230 may be extended into the second ESL 226 thereby exposing the top surface 214a of the patterned metal structure 214. This effect represents a self-alignment between the patterned metal structure 214 and the third trench 230 due, at least in part, to the earlier described selective deposition of the second ESL 226 on dielectric material of the first ILD layer 212. The foregoing method may incorporate detailed description of like structures, methods, and compositions from FIG. 4B and block 116 describing patterning and etching of the first ILD layer 212B without limitation.

Figure 16A:
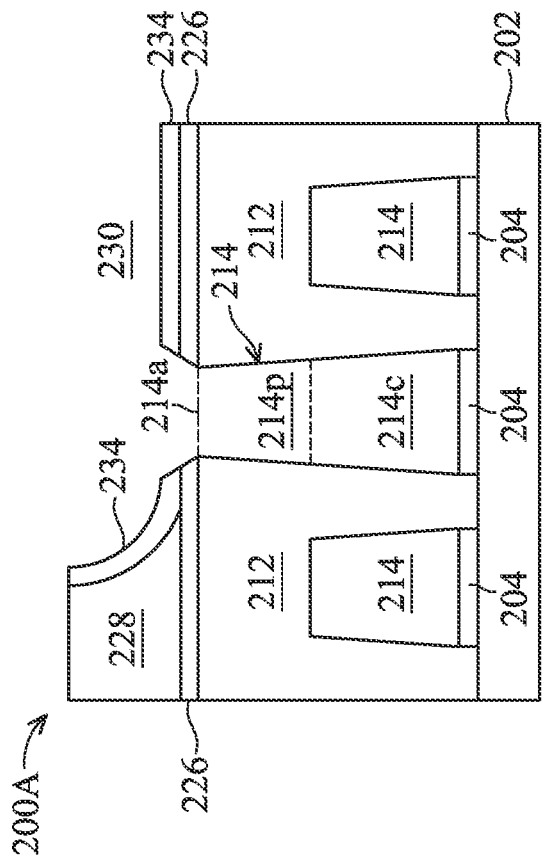
Figure 16B:
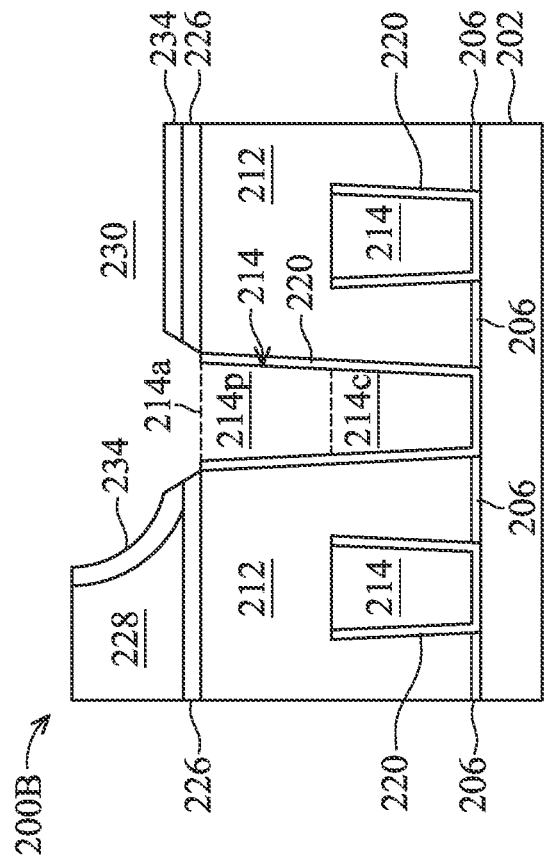

Referring to FIG. 1 and FIGS. 16A-16B, the method 100 proceeds to block 132 by selectively forming a second barrier layer 234 on the second ESL 226 and the second ILD layer 228, wherein the top surface 214a of the patterned metal structure 214 remains exposed after forming the second barrier layer 234. In some embodiments, the second barrier layer 234 may be selectively formed directly on the second ESL 226 and the second ILD layer 228. Whereas the exposed top surface 214a of the patterned metal structure 214 may remain substantially free of the second barrier layer 234 by selective deposition. In some embodiments, precursors of the second barrier layer 234 may include a functional group having a higher affinity to the second ESL 226 and the second ILD layer 228 than to the patterned metal structure 214. This difference in binding affinity may be used to selectively form the second barrier layer 234 only on the second ESL 226 and the second ILD layer 228 in a suitable deposition process, such as ALD, CVD, ELD, or spin-on coating. In some embodiments, the second barrier layer 234 may include an oxygen-containing dielectric layer such as aluminum oxide or functional groups such as (3-aminopropyl)triethoxysilane (APTES). The foregoing method may incorporate detailed description of like structures, methods, and compositions from FIG. 5 and block 118 describing formation of the first barrier layer 220 without limitation.

In some other embodiments, the second barrier layer 234 may be selectively formed using a multi-step process. In some embodiments, a first optional step may include depositing a reset layer on the top surface 214a. In some embodiments, the reset layer may be formed of cobalt or ruthenium using ALD, CVD or ELD to a thickness between about 0.5 nm and 5 nm. In some implementations, the formation of the reset layer may not include any lithography steps and may be performed in a selective, bottom-up, or self-aligned manner. In that regard, precursors and formation process of the reset layer may be selected such that the precursors selectively deposit on the exposed top surface 214a (i.e., metal or metal nitride material). In some embodiments, surfaces of the second ESL 226 and the second dielectric layer 228 may be substantially free of the reset layer.

In some embodiments, a second step may include forming a self-assembled monolayer (SAM) over the exposed top surface 214a. In some embodiments, the SAM may be formed directly on the exposed top surface 214a. In other embodiments where the reset layer is present, the SAM may be formed directly on the reset layer. The SAM may be formed of a molecule that includes a head group (or anchor) and a tail group. In some instances, the head group may include phosphorus (P), sulfur (S), or silicon (Si), which in some cases may be in the form of phosphate, sulfate, or silane. The tail group may include a carbon chain, including without limitation alkenes and alkynes. In some examples, the molecule (or the head group of the molecule) may include ODPA (octadecylphosphonic acid), organosulfur, or thiol (e.g., dodecanethiol, alkanethiol). In some other implementations, the molecule may include APTES. In some instances, the SAM may be attachable to materials making-up a conductive layer, such as the reset layer or the patterned metal structure 214 but may not substantially attach to surfaces of the second ESL 226 or the second dielectric layer 228, which are formed of dielectric materials.

In some embodiments, in a third step, the second barrier layer 234 may be deposited conformally over portions of third trenches 230 having bottom and sidewall surfaces formed of either the second ESL 226 or the second ILD layer 228. Whereas surfaces covered by the SAM, such as the exposed top surface 214*a* of the patterned metal structure 214, may remain substantially free of the second barrier layer 234 by selective deposition. In this regard, because precursors of the second barrier layer 234 may have low affinity to the SAM (i.e., the SAM may repel precursors of the second barrier layer 234), the SAM may function as a blocking layer for the second barrier layer 234. The foregoing method may incorporate detailed description of like structures, methods, and compositions from FIG. 5 and block 118 describing formation of the first barrier layer 220 without limitation. In some embodiments, a fourth step may include removing the SAM and the optional reset layer by selective etching or through an annealing process.

Figure 17A:
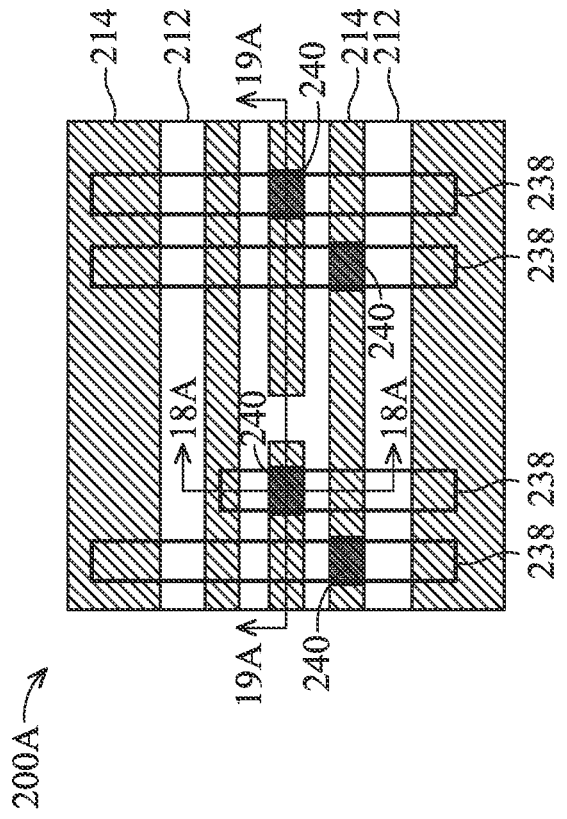
Figure 17B:
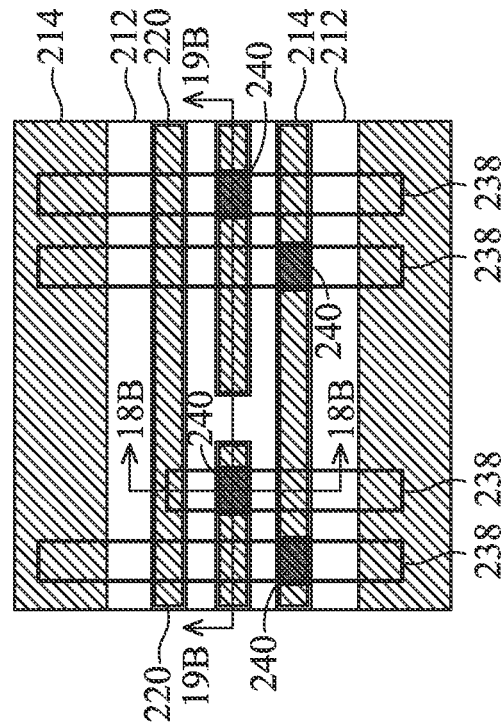
Figures 18A, 18B:
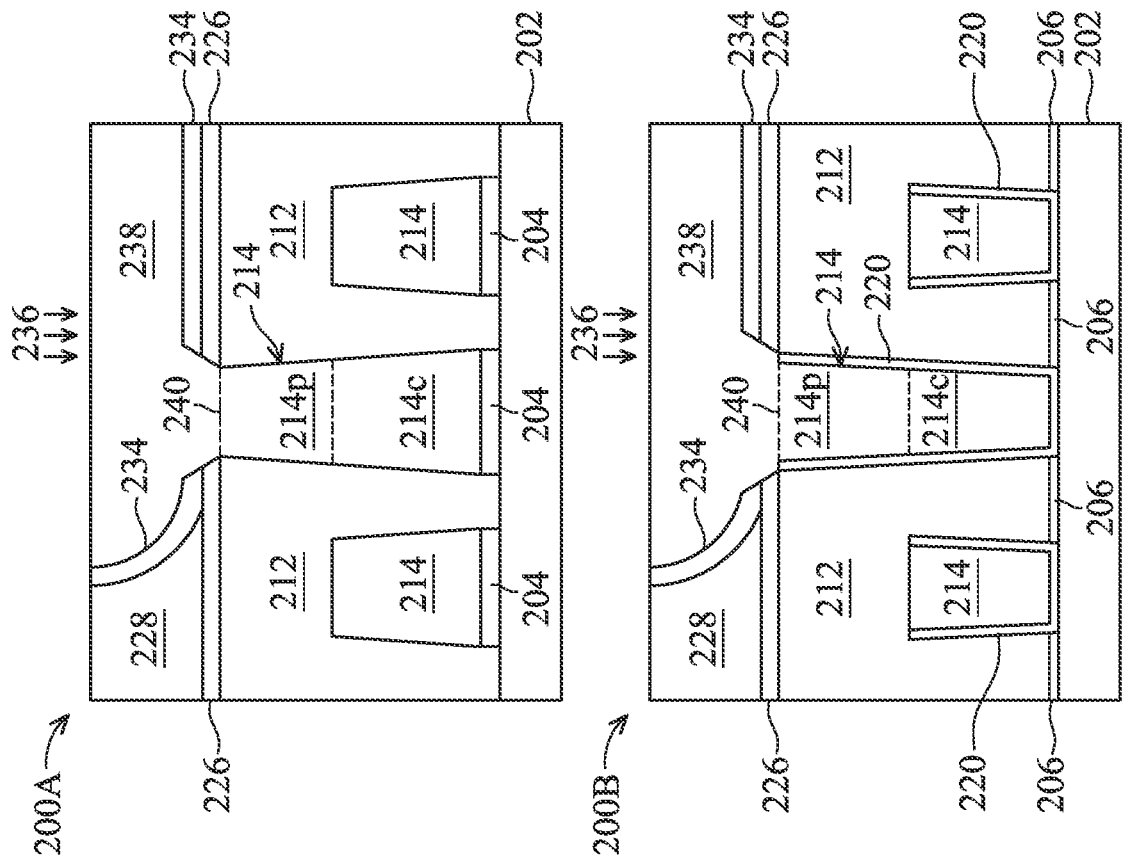
Figure 19A:
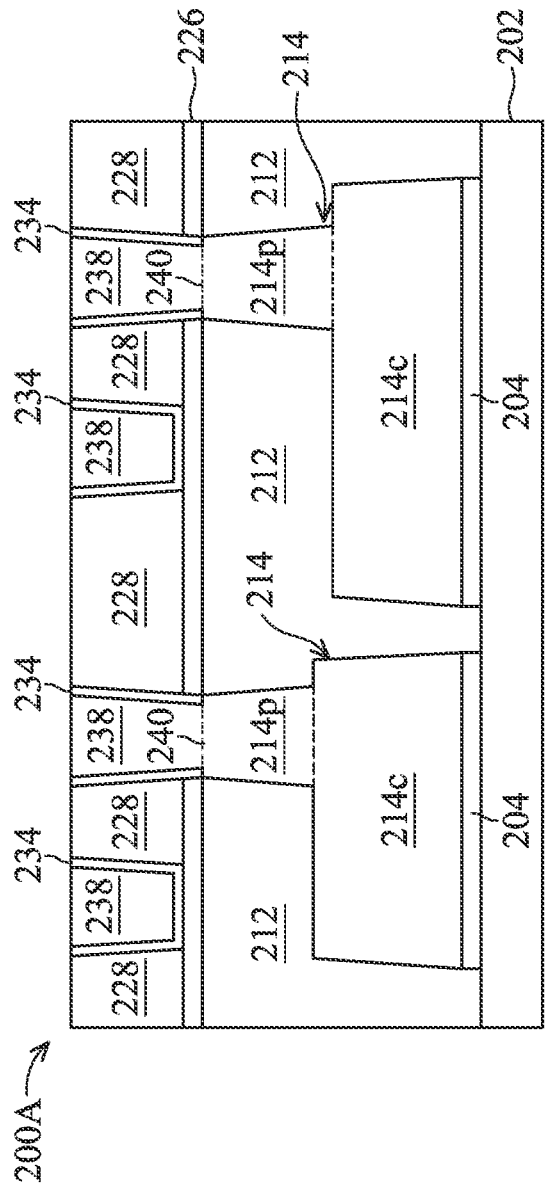
Figure 19B:
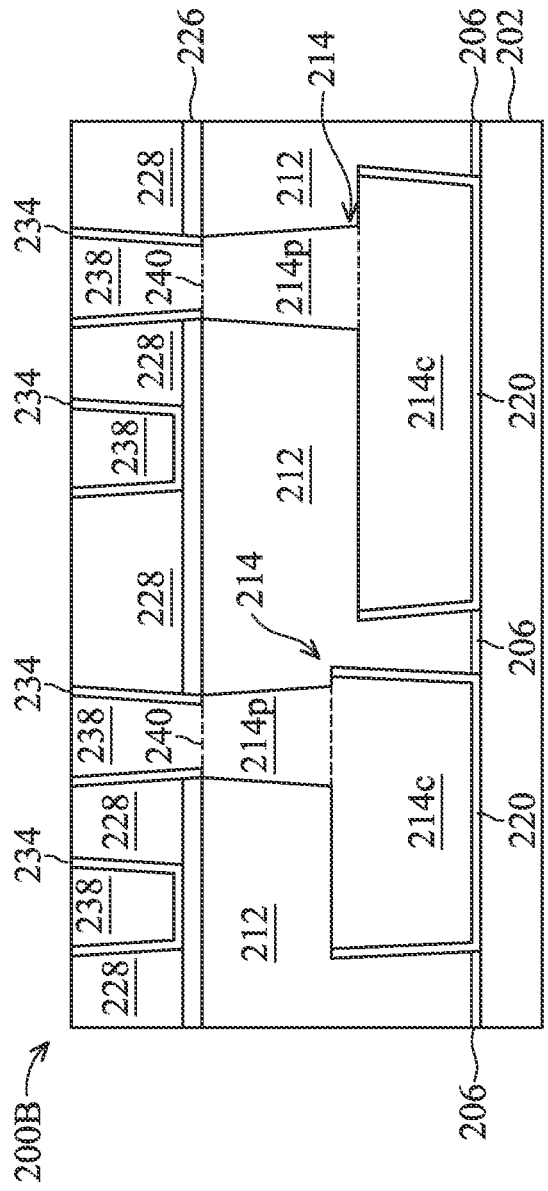

FIGS. 17A, 18A, and 19A are a plan view, a side section view along line 18A of FIG. 17A, and a side section view along line 19A of FIG. 17A, respectively, showing the semiconductor structure 200A at a step during fabrication. Likewise, FIGS. 17B, 18B, and 19B are a plan view, a side section view along line 18B of FIG. 17B, and a side section view along line 19B of FIG. 17B, respectively, showing the semiconductor structure 200B at a step during fabrication. Referring jointly to FIG. 1 and FIGS. 17A, 17B, 18A, 18B, 19A, and 19B, the method 100 proceeds to block 134 by depositing a third metal layer 236 over the second barrier layer 234 and the exposed top surface 214*a* of the patterned metal structure 214. In particular, FIGS. 17A-17B show first ILD layer 212 and patterned metal structures 214 in cross-section having positions of second metal features 238 and interfaces 240 overlaid thereon.

In some embodiments, the third metal layer 236 may fill third trenches 230 forming second metal features 238. In some embodiments, the first metal feature 214*c* and the second metal feature 238 may be connected to each other through the metal plug 214*p*. In some embodiments, a second metal feature 238 may directly contact the exposed top surface 214*a* of the patterned metal structure 214 at an interface 240 without any intervening material layers. In some embodiments, a sidewall surface of the metal plug 214*p* and a sidewall surface of the second metal feature 238 are aligned with each other at the interface 240. In some other embodiments, the interface 240 between the patterned metal structure 214 and the second metal feature 238 may include an optional liner. In some embodiments, the second barrier layer 234 may line portions of bottom and sidewall surfaces of the second metal feature 238, whereas the interface 240 between the patterned metal structure 214 and the second metal feature 238 may be free of the second barrier layer 234. In some embodiments, where the second barrier layer 234 is at least partially formed in trenches 230, second metal features 238 may form directly on the second barrier layer 234. In some embodiments, a bottom surface of the second metal feature 238 adjacent the patterned metal structure 214 may directly contact the second barrier layer 234. In other embodiments, an interface between the second metal feature 238 and the second barrier layer 234 may include an optional liner.

The foregoing method may incorporate detailed description of like structures, methods, and compositions from FIG. 3A and block 106 describing deposition of the first metal layer 208A and the second metal layer 210A without limitation. Thereafter, any excess material can be removed by a planarization process, such as a CMP process, thereby planarizing top surfaces of the second metal features 238, the second ILD layer 228, and the second barrier layer 234.

The present disclosure provides for many different embodiments. In one embodiment, a method of forming a semiconductor structure is provided. The method includes providing a semiconductor substrate; forming a patterned metal structure on the semiconductor substrate, wherein the patterned metal structure includes a first metal layer and a second metal layer deposited in a single deposition step; and etching a portion of the second metal layer thereby forming a metal plug in the second metal layer, the first metal layer of the patterned metal structure having a first metal feature underlying and contacting the metal plug.

In some embodiments, a semiconductor structure is provided. The structure includes a semiconductor substrate; a first ILD layer disposed over the semiconductor substrate; a patterned metal structure disposed in the first ILD layer, the patterned metal structure including a metal plug and a first metal feature, the patterned metal structure having a continuous sidewall slope from the metal plug to the first metal feature, and the patterned metal structure having a top surface; a second metal feature directly contacting the top surface of the patterned metal structure; and a barrier layer on bottom and sidewall surfaces of the second metal feature.

In some embodiments, the method includes providing a semiconductor structure including a semiconductor substrate and a first ILD layer disposed over the semiconductor substrate, the first ILD layer having a patterned metal structure disposed therein, the patterned metal structure including a first metal feature and a metal plug having an exposed top surface; selectively forming an ESL on the first ILD layer, wherein the top surface of the metal plug remains exposed after forming the ESL; forming a second ILD layer over the ESL and the exposed top surface of the metal plug; etching the second ILD layer to expose the top surface of the metal plug, wherein the etching of the second ILD layer includes performing an etching process using an etchant to selectively etch the second ILD layer relative to the ESL; selectively forming a barrier layer on the ESL and the second ILD layer, wherein the top surface of the metal plug remains exposed after forming the barrier layer; and forming a second metal feature over the barrier layer and the exposed top surface of the metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate;
a first ILD layer disposed over the semiconductor substrate;
a patterned metal structure disposed in the first ILD layer, the patterned metal structure including a metal plug and a first metal feature, the patterned metal structure having a continuous sidewall slope from the metal plug to the first metal feature, and the patterned metal structure having a top surface;
a second metal feature directly contacting the top surface of the patterned metal structure; and a first barrier layer on bottom and sidewall surfaces of the second metal feature.

2. The semiconductor structure of claim 1, wherein a portion of the second metal feature adjacent the patterned metal structure includes a bottom surface that directly contacts the first barrier layer.

3. The semiconductor structure of claim 1, wherein the patterned metal structure expands in width from top to bottom.

4. The semiconductor structure of claim 1, wherein the patterned metal structure narrows in width from top to bottom.

5. The semiconductor structure of claim 1, further comprising a second barrier layer disposed on sidewalls of the first metal feature.

6. The semiconductor structure of claim 5, wherein
the first metal feature is longitudinally oriented along a first direction;
the metal plug includes first sidewalls spanned along the first direction and second sidewalls spanned along a second direction;
the first sidewalls of the metal plug directly contact the first ILD layer; and
the second sidewalls of the metal plug directly contact the second barrier layer and is separated from the first ILD layer by the second barrier layer.

7. The semiconductor structure of claim 6, wherein the second barrier layer laterally encompasses and directly contacts the first metal feature.

8. The semiconductor structure of claim 7, wherein the second barrier layer further extends to cover and contact a bottom surface of the first metal feature.

9. The semiconductor structure of claim 7, further comprising a first etch stop layer (ESL) disposed underlying the first ILD layer, wherein the first ESL directly contacts the second barrier layer and the first ILD layer.

10. The semiconductor structure of claim 9, wherein a bottom surface of the first barrier layer and a bottom surface of the first ESL are coplanar.

11. The semiconductor structure of claim 9, further comprising a second ESL disposed on the first ILD layer, wherein the second ESL being extended to and aligned with edges of the patterned metal structure; and
the first barrier layer is extended to and aligned with edges of the second ESL.

12. A semiconductor structure, comprising:
a first ILD layer disposed over a substrate;
a patterned metal structure disposed in the first ILD layer, the patterned metal structure including a metal plug and a first metal layer having first metal lines, the patterned metal structure having a continuous sidewall slope from the metal plug to a first one of the first metal lines;
a second ILD layer disposed over the first ILD layer; and
a second metal layer disposed in the second ILD layer and including second metal lines, a first one of the second metal lines directly contacting a top surface of the metal plug.

13. The semiconductor structure of claim 12, further comprising a first barrier layer on bottom and sidewall surfaces of the first metal lines.

14. The semiconductor structure of claim 13, wherein
the first metal lines are longitudinally oriented along a first direction;
the metal plug includes first sidewalls spanned along the first direction and second sidewalls spanned along a second direction;
the first sidewalls of the metal plug directly contact the first ILD layer; and
the second sidewalls of the metal plug directly contact the first barrier layer and is separated from the first ILD layer by the first barrier layer.

15. The semiconductor structure of claim 13, further comprising
a second barrier layer on bottom and sidewall surfaces of the second metal lines;
a first etch stop layer (ESL) disposed underlying the first ILD layer; and
a second ESL disposed on the first ILD layer, wherein the first ESL directly contacts the second barrier layer and the first ILD layer, wherein the second ESL directly contacts the first and second barrier layers.

16. The semiconductor structure of claim 15, wherein
a bottom surface of the first barrier layer and a bottom surface of the first ESL are coplanar; and
a bottom the second barrier layer directly contacts a top surface of the second ESL.

17. The semiconductor structure of claim 16, wherein
the second barrier layer extends to cover a bottom surface of a second one of the second metal lines; and
the second one of the second metal lines is separated from the first ILD layer by the second barrier layer and the second ESL.

18. A semiconductor structure, comprising:
a first ILD layer disposed over a substrate;
a patterned metal structure disposed in the first ILD layer, the patterned metal structure including a metal plug and a first metal layer having a first and second metal lines, the patterned metal structure having a continuous sidewall slope from the metal plug to the first metal line;
a second ILD layer disposed over the first ILD layer;
a second metal layer disposed in the second ILD layer and including a third and fourth metal lines, the third metal line directly contacting a top surface of the metal plug; and
a first barrier layer disposed in the first ILD layer, wherein the metal plug includes
a first sidewall directly contacting the first ILD layer, and
a second sidewall directly contacting the first barrier layer and being separated from the first ILD layer by the first barrier layer.

19. The semiconductor structure of claim 18, further comprising
a second barrier layer disposed in the second ILD layer;
a first etch stop layer (ESL) disposed underlying the first ILD layer; and
a second ESL disposed overlying the first ILD layer, wherein a portion of the second barrier is interposed between the fourth metal line and the second ESL.

20. The semiconductor structure of claim 19, wherein
the bottom surface of the third metal line vertically extends below a bottom surface of the second barrier layer; and
the fourth metal line include a bottom surface disposed on a top surface of the second barrier layer.

* * * * *